United States Patent
Franz et al.

(10) Patent No.: US 10,185,375 B2
(45) Date of Patent: Jan. 22, 2019

(54) THERMAL BUS BAR

(71) Applicant: Hewlett Packard Enterprise Development LP, Houston, TX (US)

(72) Inventors: John Franz, Houston, TX (US); Tahir Cader, Liberty Lake, TX (US); William K. Norton, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/550,500

(22) PCT Filed: Feb. 13, 2015

(86) PCT No.: PCT/US2015/015893
§ 371 (c)(1),
(2) Date: Aug. 11, 2017

(87) PCT Pub. No.: WO2016/130153
PCT Pub. Date: Aug. 18, 2016

(65) Prior Publication Data
US 2018/0032113 A1    Feb. 1, 2018

(51) Int. Cl.
*H05K 7/20*    (2006.01)
*G06F 1/20*    (2006.01)
(Continued)

(52) U.S. Cl.
CPC ............... *G06F 1/20* (2013.01); *F28D 15/00* (2013.01); *G05D 23/1928* (2013.01); *H05K 7/20* (2013.01);
(Continued)

(58) Field of Classification Search
None
See application file for complete search history.

(56) References Cited

U.S. PATENT DOCUMENTS 2,779,608 A    1/1957    Abbey
7,318,322 B2   1/2008    Ota
(Continued)

FOREIGN PATENT DOCUMENTS

JP    2002374086    12/2002
JP    2012054499    3/2012
(Continued)

OTHER PUBLICATIONS

HP Apollo F8000 Rack. Retrieved from Internet Sep. 5, 2014, http://www8.hp.com/us/en/products/rack-cooling/product-detail.html?oid=7152905.

(Continued)

*Primary Examiner* — Dimary Lopez Cruz
*Assistant Examiner* — Zhengfu Feng
(74) *Attorney, Agent, or Firm* — Dhand Law PC

(57) ABSTRACT

An example method includes positioning a thermal bus bar into a bus bar support channel of a cooling wall, the cooling wall comprising a plurality of thermal bus bars. The positioning comprises removably connecting first portions of at least two dripless connectors coupled to a fluid flow path of the thermal bus bar to second portions of the dripless connectors coupled to coolant transport lines that receive and return coolant from a coolant source. The method further includes flowing coolant received from the coolant transport lines through the fluid flow path and returning the coolant to the coolant transport lines. The thermal bus bar is positioned while coolant provided by the coolant transport lines is flowing through other thermal bus bars of the cooling wall.

15 Claims, 6 Drawing Sheets

(51) Int. Cl.
*F28D 15/00* (2006.01)
*G05D 23/19* (2006.01)

(52) U.S. Cl.
CPC ... *H05K 7/20781* (2013.01); *G06F 2200/201* (2013.01)

(56) References Cited

U.S. PATENT DOCUMENTS

| | | |
|---|---|---|
| 7,564,685 B2 | 7/2009 | Clidaras |
| 7,593,227 B2 | 9/2009 | Campbell |
| 7,944,694 B2 | 5/2011 | Campbell |
| 2007/0002536 A1 | 1/2007 | Hall et al. |
| 2008/0018212 A1* | 1/2008 | Spearing ............ E05D 11/00 312/236 |
| 2008/0123297 A1 | 5/2008 | Tilton |
| 2008/0310104 A1 | 12/2008 | Campbell |
| 2010/0002393 A1 | 1/2010 | Campbell |
| 2013/0043775 A1 | 2/2013 | Chen |
| 2014/0218858 A1 | 8/2014 | Shelnutt |

FOREIGN PATENT DOCUMENTS

| | | |
|---|---|---|
| WO | WO-2013119243 | 8/2013 |
| WO | WO-2013137847 A1 | 9/2013 |
| WO | WO-2014209334 A1 | 12/2014 |

OTHER PUBLICATIONS

Extended European Search Report, EP Application No. 15882235.3, dated Dec. 1, 2017, pp. 1-12, EPO.

\* cited by examiner

THERMAL BUS BAR

BACKGROUND

In some cooling systems, cooling units of a cooling wall are coupled to a coolant source using tubes and or hoses clamped to adapters. In these cooling systems, tube diameter tolerance and quality of the tubes, hoses and/or clamps may result in leaks and may have unknown long term performance under temperature and pressure. Many of these cooling wall systems suffer from an inability to remove cooling units individually, thereby requiring the coolant be shut off to the entire cooling wall and removing the entire cooling wall for repair. This results in high service cost, long down time and possible high risk to water leak issues that may damage computing units within a rack.

BRIEF DESCRIPTION OF THE DRAWINGS

For a more complete understanding of various examples, reference is now made to the following description taken in connection with the accompanying drawings in which.

DETAILED DESCRIPTION

Example systems and methods described herein resolve many flaws in current coolant wall cooling systems by, for example, improving reliability of fluid connections of the coolant source to thermal bus bars. These systems and methods may also result in reduced assembly time/cost, reduced inventory costs, lower repair costs, improved down time and higher user satisfaction. In various examples, "fixed" hose connections are replaced with automatic valve seal blind mate dripless connectors to offer a host of benefits.

In various examples, a blind mate connector system stops the flow of coolant (e.g., water or other known coolant) to a thermal bus bar (TBB) of a coolant wall with a spring loaded integrated auto shut off valve. This type of connector system allows removal of a single TBB without a risk of water leakage.

In various examples, each coolant wall is built with shelves (e.g., aluminum extruded shelves) to support the TBBs and allow associated computing units (e.g., blade servers) to be thermally connected (e.g., clamped) to the TBB. Each shelf provides an acceptor device for accepting a frame support of a TBB in a gap between the acceptor and a main structural wall of the coolant wall. The gap defined by the acceptor allows for mating a support frame (e.g., a T-frame feature) of the TBB to be captured yet be free to slide forward and back for making a removable connection to coolant transport lines of the cooling wall. The TBB may be kept in place by a removal bracket which can be attached or removed while coolant is flowing through the coolant wall and while computing units above and below the TBB are still installed and operating, thereby greatly reducing service time and component risk.

Various examples may allow for removal of a computing unit associated with the TBB, removal of the removal bracket, removal of the TBB and installation of a new TBB in less than 5 minutes, which is much less than the time needed to remove multiple computing units and removing and replacing an entire coolant wall, as is done on existing coolant wall systems.

Figure 2:
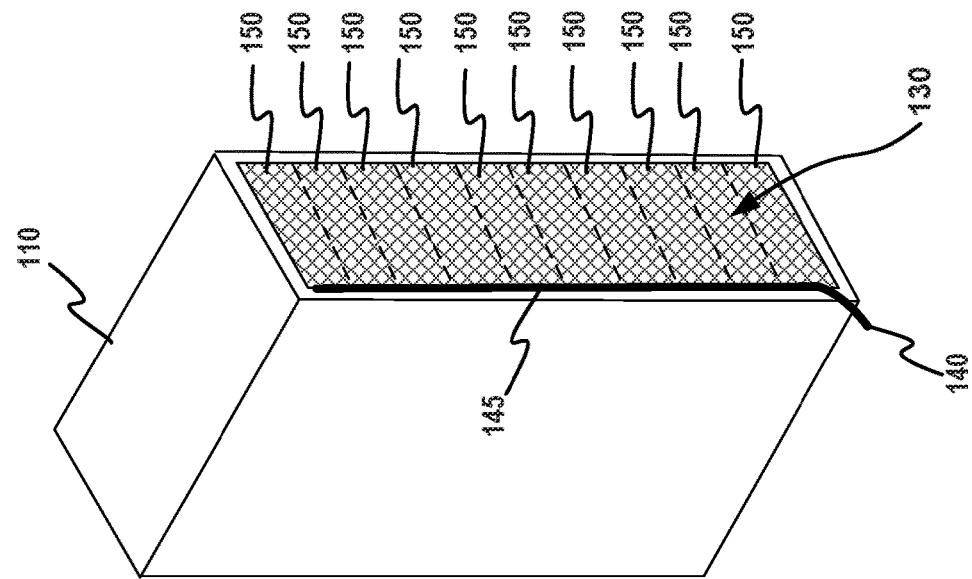
FIG. 2 illustrates a rear elevation view of the example computer rack unit of FIG. 1.
Figure 1:
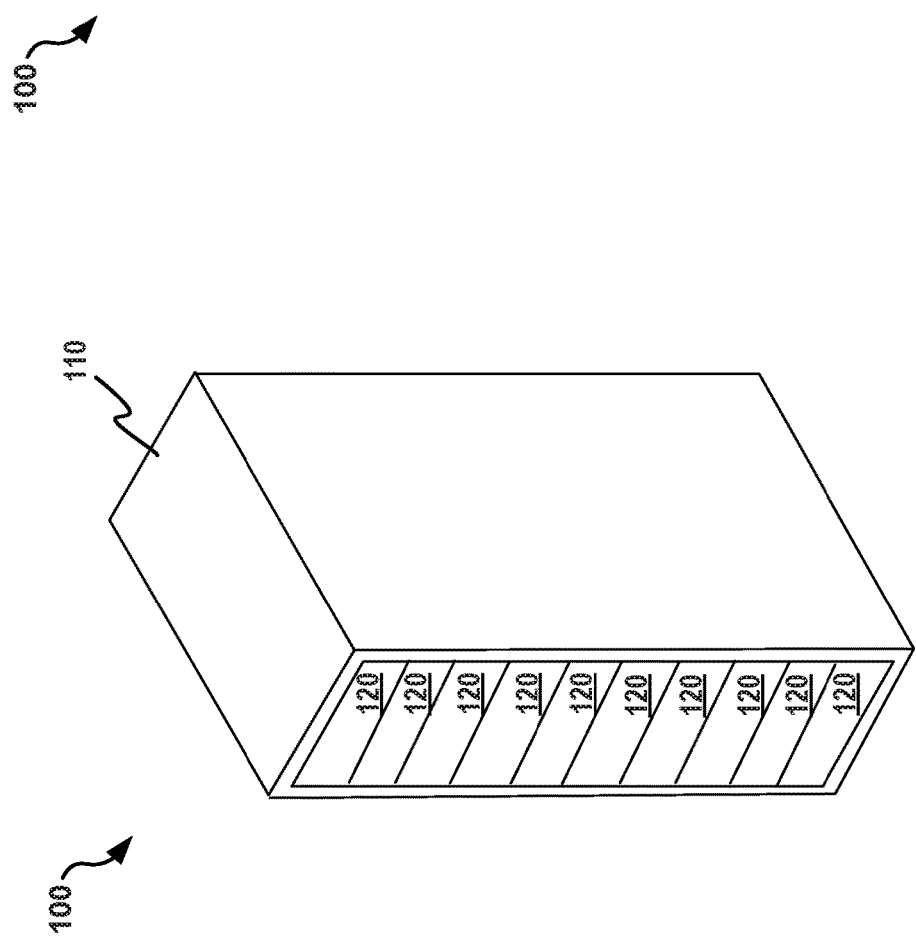
FIG. 1 illustrates a front elevation view of an example computer rack unit.

Referring now to the figures, FIG. 1 illustrates a front elevation view of an example computer rack unit 100 that includes a cooling wall 130 (shown in FIG. 2) for cooling computing units 120 housed in the computer rack unit 100. FIG. 2 illustrates a rear elevation view of the example computer rack unit 100. The computer rack unit 100 includes a housing 110 configured to house the computing units 120 and to be coupled to the cooling wall 130 including a plurality of thermal bus bars 150. The cooling wall 130 is coupled to a rear portion of the housing 110. The cooling wall 130 is coupled to a coolant source such as, in this example, a facility coolant connection 140. In various examples, the coolant source is a water source. Coolant coming into the cooling wall 130 from the coolant connection 140 is distributed through coolant transport lines 145 to manifolds that split out to the thermal bus bars 150. Within each thermal bus bar 150, coolant is distributed in parallel fashion to fluid flow paths (e.g., tubing, lines, conduits, channels) within the thermal bus bars 150, as represented by the cross hatching in FIG. 2, and returned to the coolant transport lines 145. The return flow from the thermal bus bars 150 may be combined into one output flow in the coolant transport lines 145, which may be forwarded to other systems to be used for other purposes (e.g., to a heat exchanger to be cooled or to a heating facility to heat offices).

In various examples, use of the cooling wall 130 with the thermal bus bars 150 may result in reduced service time, an ability to change thermal bus bar designs and quickly install the newly designed thermal bus bars 150, and improved shipping options by allowing the thermal bus bars 150 to be shipped separately from the main cooling wall 130. In addition, various examples may improve deployment options, may allow for out of rack "offline" tests of the thermal bus bars 150 prior to assembly or in the field, and an improved spares and service inventory. Further, use of the cooling wall 130 with the thermal bus bars 150 may eliminate the need for risky removal of cooling wall 130 tubing connections thus less risk of water getting on the computing units 120, and may eliminate the risk of damaging or pulling out power and network wires in the back of the computer rack unit 100.

Figure 3:
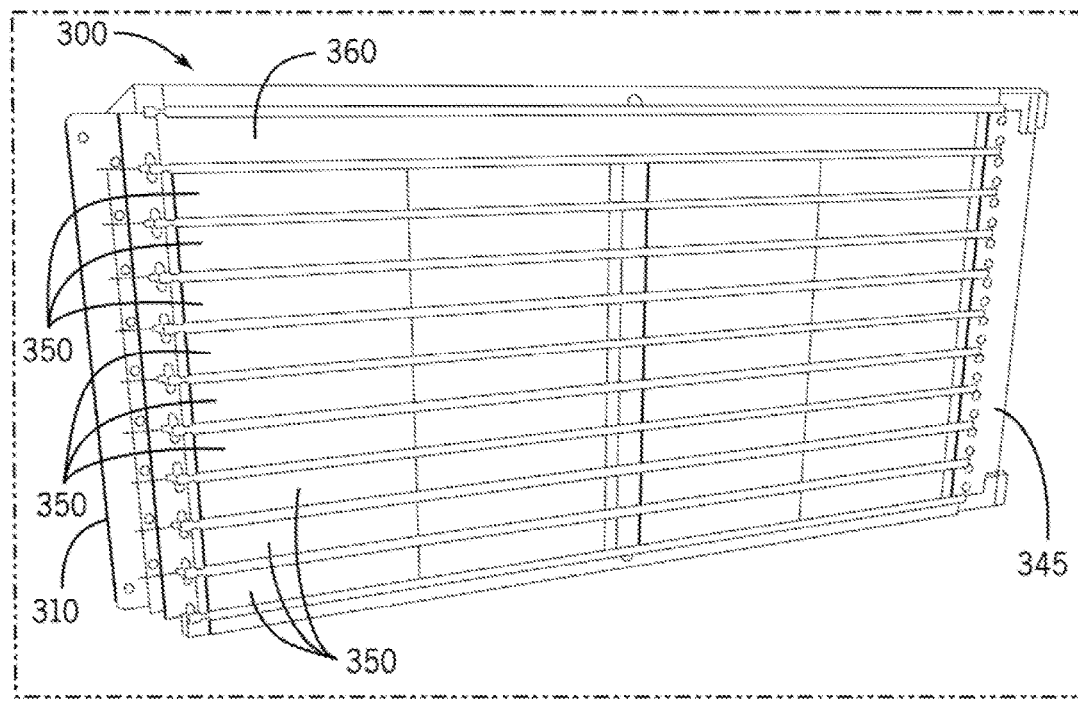
FIG. 3 illustrates an example cooling wall including example thermal bus bars.

FIG. 3 illustrates an example cooling wall 300 including example thermal bus bars 350 for cooling computing units such as the computing units 120 of FIG. 1. The cooling wall 300 includes a main wall 310 upon which the thermal bus bars 350 are coupled. The cooling wall 300 also includes a coolant transport channel 345 housing coolant transport lines such as the coolant transport lines 145 described above in reference to FIGS. 1 and 2.

The thermal bus bars 350 are removably coupled to the main wall 310 within bus bar support channels 360, one of which is empty in the uppermost position of the cooling wall 300 in FIG. 3. The thermal bus bars 350, in this example, are slideably coupled to the main wall 310 where the thermal bus bars 350 may be positioned into the bus bar channels and slid parallel to the main wall 310 to be inserted or removed from the cooling wall 300 and engaged or disengaged from dripless connectors coupling the coolant transport lines in the coolant transport channel 345 to input and return ports coupled to the fluid flow paths of the thermal bus bars 345.

In various examples, the thermal bus bars 350 may serve as secondary heat exchangers for computing units (e.g., blade servers) of a rack system such as the computer rack unit 100 of FIGS. 1 and 2. The computing units may have a primary heat exchange system within the computing units such as a liquid cooled heat exchanger coupled to the processors (e.g., central processing units or CPUs) of the computing units. The thermal bus bars 350 may be thermally coupled to a heat dissipating system of the computing units via a dry heat sink interface such that there is no exchange of coolants between the thermal bus bars 350 and the cooling system of the computing units. In this way, the thermal bus bars 350 may further cool the computing units.

The surface of the thermal bus bars 350 and the dry heat sink interface of the computing units may be manufactured of thermal materials which improve thermal conductivity. Accordingly, the primary heat exchanger of the computing units is efficiently thermally engaged with the thermal bus bars 350 to transfer heat from the computing units to a coolant in the thermal bus bars 350. In this way, the coolant provided by and returned to the coolant transport lines in the coolant transport channel 345 transports heat away from the rack system. A clamping mechanism may maintain contact between the dry heat sink interface of the computing units and the thermal bus bars 350. The clamping mechanism may be any suitable connection system, such as a spring-loaded connector.

Figure 4:
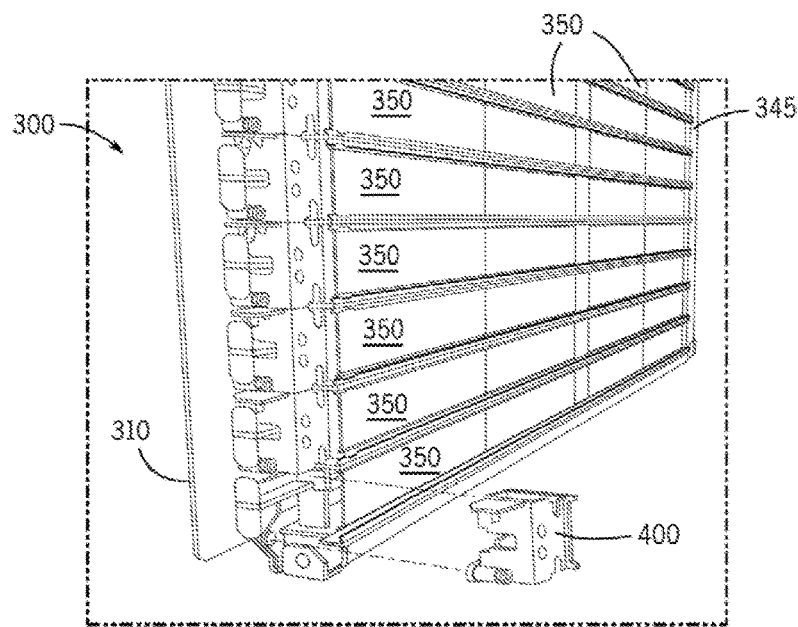
FIG. 4 illustrates the example cooling wall of FIG. 3 with an example removable bracket.

FIG. 4 illustrates an example removal bracket 400 for securing thermal bus bars 350 to the cooling wall 300. The removal bracket 400 may be secured to the main wall 310 by various securing means such as, for example bolts. In various examples, the removal bracket 400 may be removed from the main wall by removing or disengaging the securing means while the cooling wall 300 is attached to the rack system which it is cooling. In this way, the thermal bus bars 350 may be removed, or added, to the cooling wall 300 while the cooling wall is in operation, without interrupting coolant flow to the other thermal bus bars 350.

Figure 5:
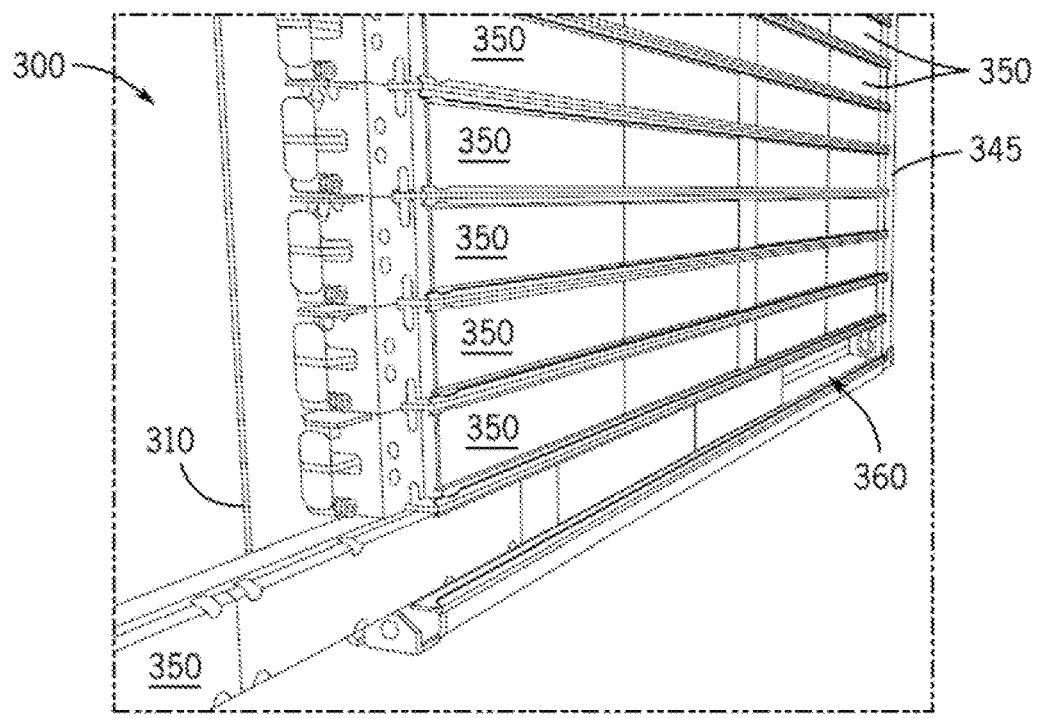
FIG. 5 illustrates partial removal of an example thermal bus bar from an example cooling wall.
Figure 6:
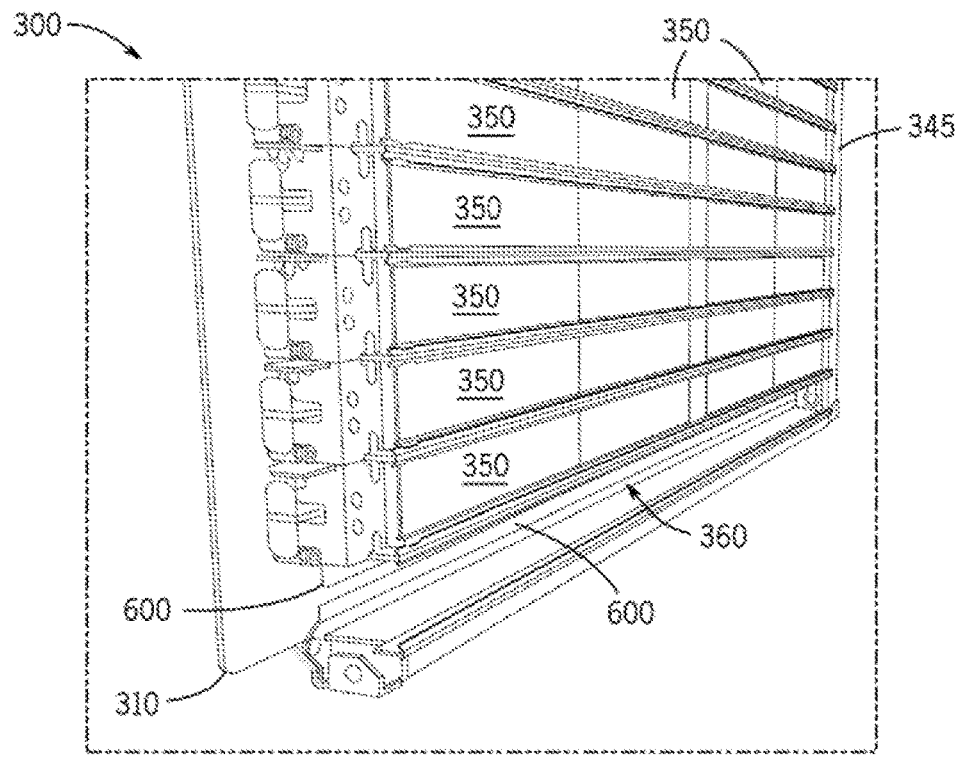
FIG. 6 illustrates complete removal of an example thermal bus bar from an example cooling wall.

FIGS. 5 and 6 illustrate, respectively, partial and full removal of one of the thermal bus bars 350 from one of the bus bar support channels 360 of the cooling wall 300 after removal of the removal bracket 400. As best shown in FIG. 6, an acceptor mechanism 600 is coupled to the main wall 310 to accept a mounting frame of the thermal bus bar 350 to slideably secure the thermal bus bar 350 to the main wall 310. In this example, the acceptor mechanism 600 is a T-frame acceptor that accepts a T-frame support (not shown) mounted to a hack side of the thermal bus bar 350. Details of an example T-frame support and T-frame acceptor are described below in reference to FIG. 9.

Figure 7:
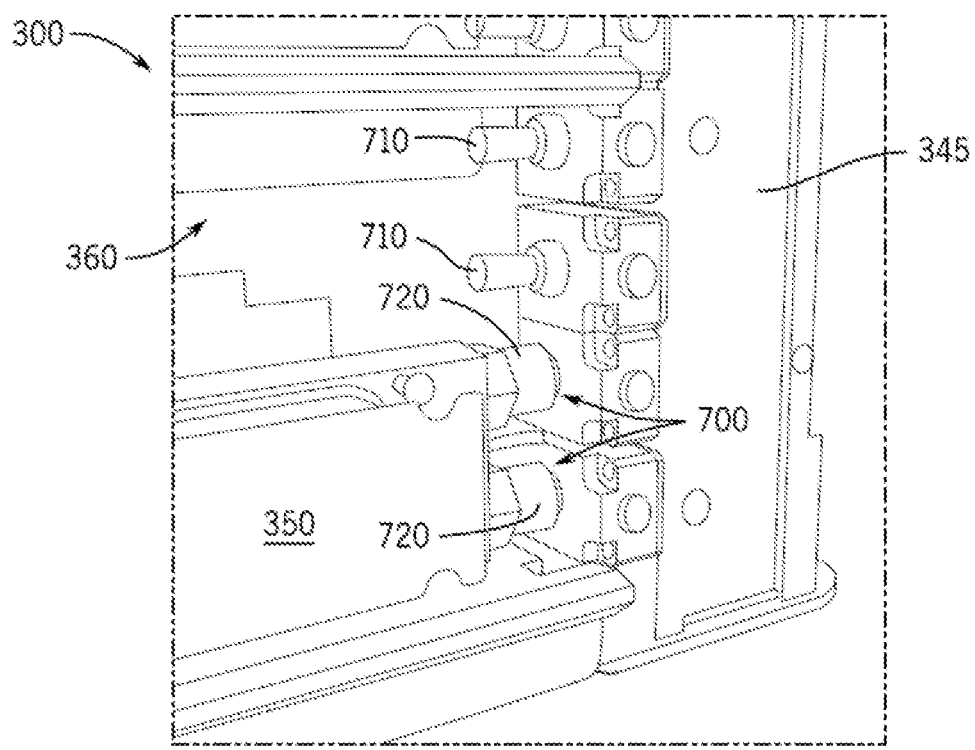
FIG. 7 illustrates example dripless connectors for use with an example thermal bus bar.

FIG. 7 illustrates example dripless connectors 700 that may be used to connect the thermal bus bars 350 to the coolant transport lines in the coolant transport channel 345 of the cooling wall 300. In various examples, the dripless connectors 700 may be blind mate type dripless connectors. Each of the dripless connectors 700 comprises a first connector portion coupled to one of the thermal bus bars 350 and a second connector portion coupled to the coolant transport lines of the coolant transport channel 345. As illustrated in FIG. 7, the example dripless connectors 700 each include a male connector 710 coupled to the coolant transport lines of the coolant transport channel 345 and a female connector portion 720 connected to the thermal bus bar 350. In the example shown, each thermal bus bar 350 is coupled to two of the dripless connectors 700, including a first dripless connector 700 to receive coolant from the coolant transport lines and a second dripless connector 700 to return fluid to the coolant transport lines. Other examples may use more dripless connectors.

Figure 8:
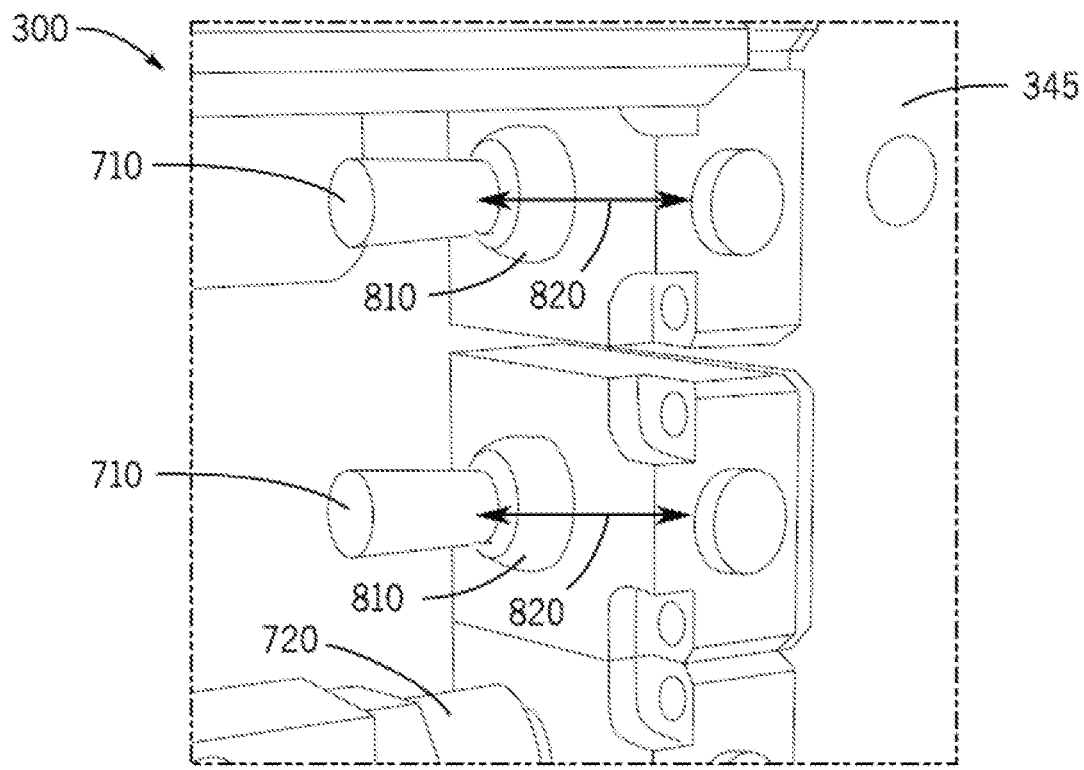
FIG. 8 illustrates example motion provided by an example dripless connector.

FIG. 8 illustrates a side-to-side motion (as indicated by the arrows 820) provided by the dripless connectors 700 that occurs while a thermal bus bar is engaging or disengaging from the dripless connector 700. In various examples the male connector portion 710 of the dripless connector 700 is provided with a translational ability provided by a connector cutout 810. The male connector portion 710 is positioned in a spring loaded travel channel to allow the male connector portion 710 to translate in response to articulation of the thermal bus bar 350 during removal or insertion of the thermal bus bar 350 in the bus bar support channel 360. The spring loaded feature assures connector alignment during installation and after removal, and also assures valve closure after removal. In some examples, valve closure may be facilitated, independently of the translational ability, by a spring positioned within the valve (e.g., inside a vertical stem of the valve).

In the example shown in FIG. 8, the male connector portion 710 of each of the dripless connectors 700 is configured to be translated in a direction perpendicular to the main wall 310 to be engaged or disengaged from the respective female connector portion 720 when one of the thermal bus bars 350 is being installed or removed. Other various examples may translate in other various directions relative to the main wall 310. Further, in some examples, spring loading of the thermal bus bar 350 may facilitate thermal connection with blade servers when the thermal bus bar 350 is installed and engaged perpendicular to the main wall 310. For example, the spring loading may bias the thermal bus bar 350 towards the blade servers to facilitate thermal transfer.

Figure 9:
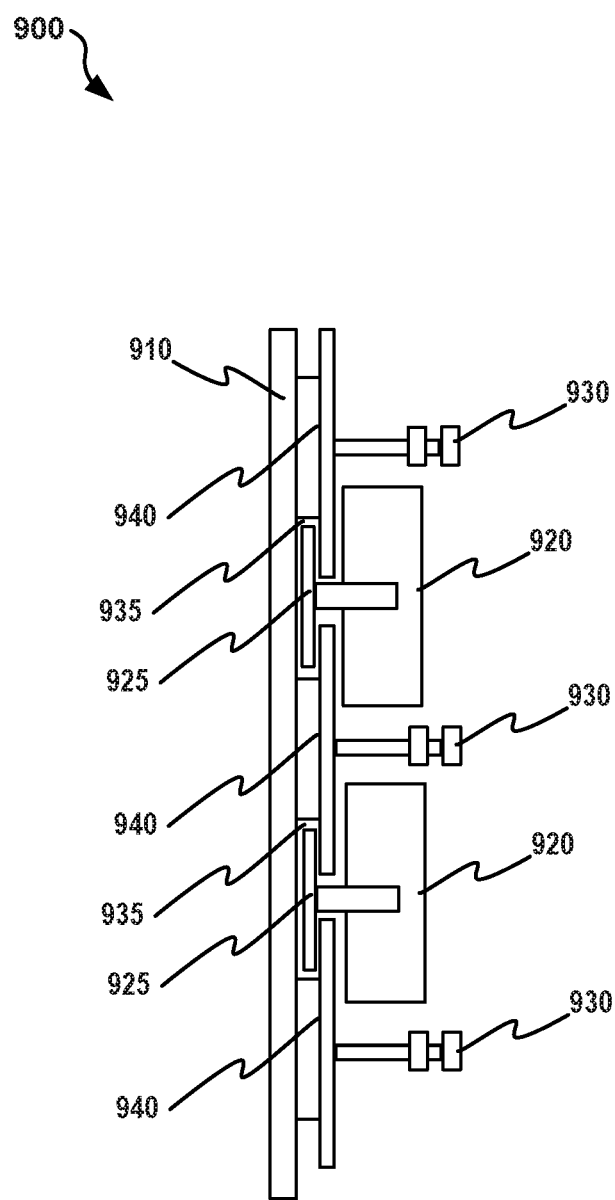
FIG. 9 illustrates a cross sectional view of an example cooling wall and example thermal bus bars.

FIG. 9 illustrates an example cross sectional view of a cooling wall 900 and thermal bus bars 920. The thermal bus bars 920 are each mounted on a T-frame 925. The T-frame 925 is positioned within a gap 935 defined by a T-frame acceptor including a pair of T-frame acceptor structures 940 that are coupled to a main wall 910 of the cooling wall 900. In the example cooling wall 900, the T-frame acceptor structures 940 form a base for shelf components 930. The shelf components 930 may serve as structures for a clamp mechanism of a computing unit (e.g., a blade server) to securely anchor a dry heat sink interface of the computing unit to be in thermal contact with the thermal bus bar 920, as discussed above.

Figure 10:
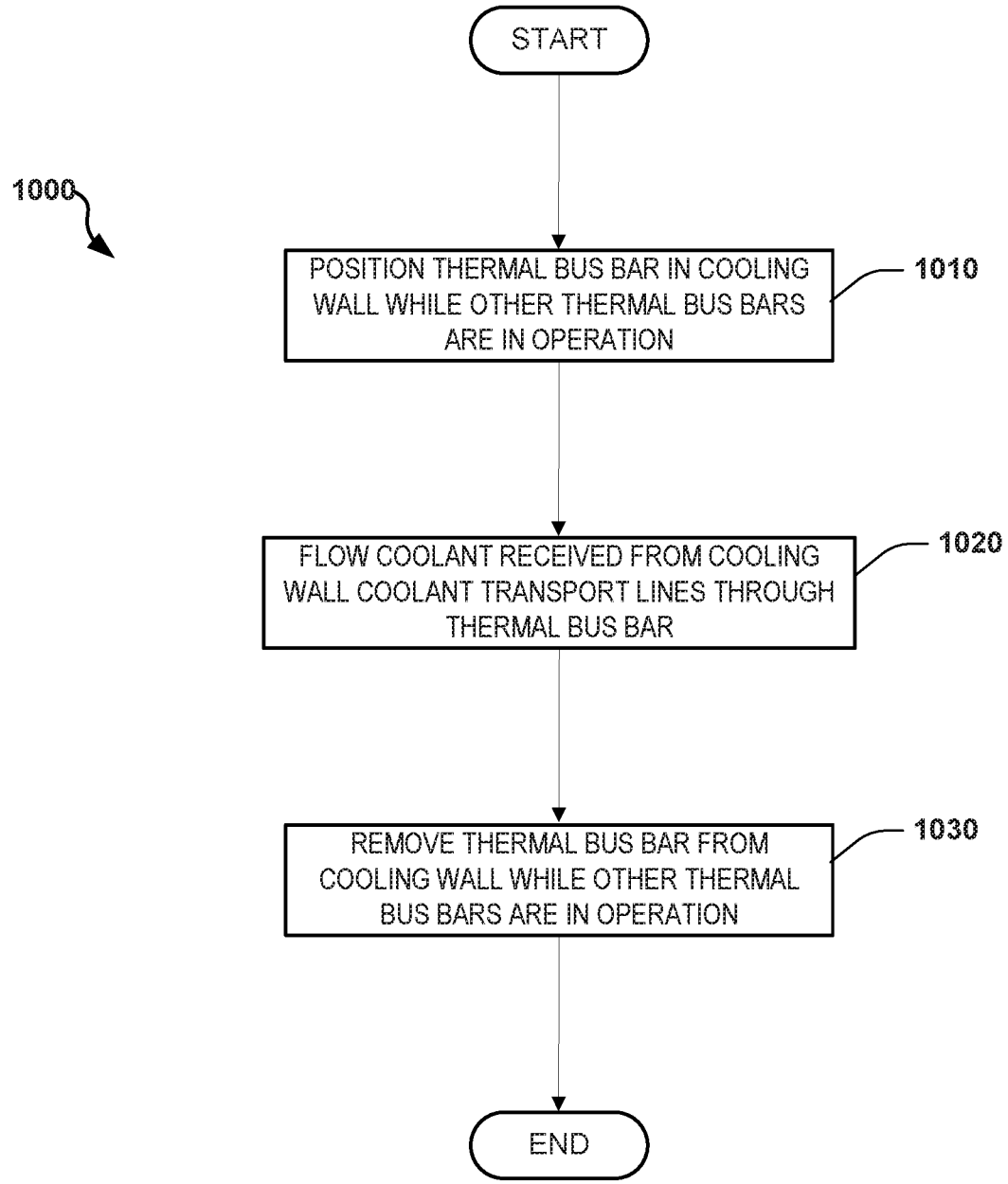
FIG. 10 illustrates a flow diagram of an example process for connecting and removing an example thermal bus bar.

FIG. 10 illustrates an example flow diagram for an example process 1000 for connecting and removing a thermal bus bar from a cooling wall while the cooling wall is operating. The process 1000 is exemplary only and may be modified. The example process 1000 of FIG. 10 will now be described with further references to FIGS. 3-8.

Referring now to FIG. 10, the thermal bus bar 350 is positioned into one of the bus bar support channels 360 of the cooling wall 300, block 1010. As the cooling wall 300 includes a plurality of thermal bus bars 350, some or all of the other thermal bus bars 350 may already be inserted into respective thermal bus bar channels 360 and operating (i.e., coolant provided by the coolant transport lines is flowing through the other thermal bus bars 350 of the cooling wall 300) while the thermal bus bar 350 is being positioned.

In various examples, the positioning at block 1010 includes removably connecting first portions (e.g., the female connector portions 720 of FIG. 7) of at least two dripless connectors (e.g., the dripless connectors 700), which are each coupled to a fluid flow path of the thermal bus bar 350, to second portions (e.g., the male connector portions 710) of the dripless connectors, which are each coupled to the coolant transport lines in the coolant transport channel 345 that receive and return coolant from a coolant source. The positioning at block 1010 may include positioning the thermal bus bar 350 to be accepted by the bus bar support channel by sliding a T-frame coupled to the thermal bus bar 350 into a T-frame acceptor coupled to the cooling wall 300 in the bus bar support channel 360, as described above.

At stage 1020, subsequent to the dripless connectors 700 being connected, coolant received from the coolant transport lines flows through the fluid flow path of the thermal bus bar 350 via one of the dripless connectors 700 and returns to the coolant transport lines via the other one of the dripless connectors 700.

At stage 1030, subsequent to the coolant having started to flow through the thermal bus bar 350, the thermal bus bar 350 is removed from the bus bar support channel 360 to disengage the first portions of the dripless connectors from the second portions while coolant is still flowing to the other thermal bus bars without interrupting flow of the coolant. The removal at stage 1030 may be in response to a leak being detected in the thermal bus bar 350, may be due to a scheduled change of the thermal bus bar 350 due to a redesign or due to an expiration of an expected life time of the thermal bus bar 340, or may be due to other reasons.

The foregoing description of various examples has been presented for purposes of illustration and description. The foregoing description is not intended to be exhaustive or limiting to the examples disclosed, and modifications and variations are possible in light of the above teachings or may be acquired from practice of various examples. The examples discussed herein were chosen and described in order to explain the principles and the nature of various examples of the present disclosure and its practical application to enable one skilled in the art to utilize the present disclosure in various examples and with various modifications as are suited to the particular use contemplated. The features of the examples described herein may be combined in all possible combinations of methods, apparatus, modules, systems, and computer program products.

It is also noted herein that while the above describes examples, these descriptions should not be viewed in a limiting sense. Rather, there are several variations and modifications which may be made without departing from the scope as defined in the appended claims.

What is claimed is:

1. A device, comprising:
    a housing to house a plurality of computing units;
    a cooling wall coupled to the housing, the cooling wall comprising:
        a main wall;
        coolant transport lines to receive and return coolant from a coolant source;
        a plurality of thermal bus bars each comprising an internal fluid flow path; and
        a plurality of dripless connectors, each dripless connector comprising a first connector portion coupled to one of the thermal bus bars and a second connector portion coupled to the coolant transport lines, each thermal bus bar being coupled to at least two of the plurality of dripless connectors to receive the coolant from the coolant transport lines and return the coolant to the coolant transport lines,
    wherein the plurality of thermal bus bars are coupled to the main wall and to the plurality of dripless connectors such that each thermal bus bar may be removed from the cooling wall independently of the other thermal bus bars without interrupting the coolant flowing through the other thermal bus bars.

2. The device of claim 1, wherein, the plurality of thermal bus bars are slideably coupled to the main wall such that each thermal bus bar may be disconnected from the coolant transport lines via the dripless connectors by sliding the thermal bus bar parallel to the main wall.

3. The device of claim 2, wherein the thermal bus bars each comprise a T-frame and the thermal bus bars are slideably coupled to the main wall with the T-frame contained within a T-frame acceptor that accepts a portion of the T-frame within.

4. The device of claim 1, further comprising a plurality of removal brackets, one of the plurality of removal bracket to secure a respective one of the plurality of thermal bus bars against the main wall, each removal bracket configured to be removed such that the respective thermal bus bar may be removed independently from the cooling wall.

5. The device of claim 1, wherein the second portion of each of the plurality of dripless connectors is configured to be translated in a direction perpendicular to the main wall to be disengaged from the respective first portion of the dripless connector when one of the thermal bus bars is being removed.

6. The device of claim 5, wherein the second portions of the dripless connectors are spring loaded such that after being disengaged, a spring translates the second portion of the dripless connector to shut a valve of the coolant transport lines.

7. A device, comprising:
    a cooling wall configured to couple to a computer rack to cool computing units contained in the computer rack, the cooling wall comprising:
        a main wall;
        coolant transport lines to receive and return coolant from a coolant source;
        a plurality of thermal bus bars each comprising an internal fluid flow path; and
        a plurality of dripless connectors, each dripless connector comprising a first connector portion coupled to one of the thermal bus bars and a second connector portion coupled to the coolant transport lines, each thermal bus bar being coupled to at least two of the plurality of dripless connectors to receive the coolant from the coolant transport lines and return the coolant to the coolant transport lines,
    wherein the plurality of thermal bus bars are coupled to the main wall and to the plurality of dripless connectors such that each thermal bus bar may be removed from the cooling wall independently of the other thermal bus bars without interrupting the coolant flowing through the other thermal bus bars.

8. The device of claim 7, wherein, the plurality of thermal bus bars are slideably coupled to the main wall such that each thermal bus bar may be disconnected from the coolant transport lines via the dripless connectors by sliding the thermal bus bar parallel to the main wall.

9. The device of claim 8, wherein the thermal bus bars each comprise a T-frame and the thermal bus bars are slideably coupled to the main wall with the T-frame contained within a T-frame acceptor that accepts a portion of the T-frame within.

10. The device of claim 7, further comprising a plurality of removal brackets, one of the plurality of removal bracket to secure a respective one of the plurality of thermal bus bars against the main wall, each removal bracket configured to be removed such that the respective thermal bus bar may be removed independently from the cooling wall.

11. The device of claim 7, wherein the second portion of each of the plurality of dripless connectors is configured to be translated in a direction perpendicular to the main wall to be disengaged from the respective first portion of the dripless connector when one of the thermal bus bars is being removed.

12. The device of claim 11, wherein the second portions of the dripless connectors are spring loaded such that after being disengaged, a spring translates the second portion of the dripless connector to shut a valve of the coolant transport lines.

13. A method, comprising:
positioning a thermal bus bar into a bus bar support channel of a cooling wall, the cooling wall comprising a plurality of other thermal bus bars, the positioning comprising removably connecting first portions of at least two dripless connectors coupled to a fluid flow path of the thermal bus bar to second portions of the dripless connectors coupled to coolant transport lines that receive and return coolant from a coolant source; and
flowing the coolant received from the coolant transport lines through the fluid flow path and returning the coolant to the coolant transport lines,
wherein the thermal bus bar is positioned while the coolant provided by the coolant transport lines is flowing through other thermal bus bars of the cooling wall.

14. The method of claim 13, further comprising removing the thermal bus bar from the bus bar support channel to disengage the first portions of the dripless connectors from the second portions while coolant is flowing to the other thermal bus bars without interrupting flow of the coolant.

15. The method of claim 13, wherein positioning the thermal bus bar to be accepted by the bus bar support channel comprises sliding a T-frame coupled to the thermal bus bar into a T-frame acceptor coupled to the cooling wall in the bus bar support channel.

* * * * *